United States Patent
Nayak

(10) Patent No.: US 9,287,869 B2
(45) Date of Patent: Mar. 15, 2016

(54) DATA BUS SYNCHRONIZER WITHOUT AN ENABLE SIGNAL INPUT

(71) Applicant: Texas Instruments Incorporated, Dallas, TX (US)

(72) Inventor: Gopalkrishna Ullal Nayak, Bangalore (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 211 days.

(21) Appl. No.: 14/106,778

(22) Filed: Dec. 15, 2013

(65) Prior Publication Data

US 2014/0189414 A1 Jul. 3, 2014

Related U.S. Application Data

(60) Provisional application No. 61/746,768, filed on Dec. 28, 2012.

(51) Int. Cl.
| | | |
|---|---|---|
| G06F 13/42 | (2006.01) | |
| H03K 19/003 | (2006.01) | |
| G06F 1/10 | (2006.01) | |
| H03K 5/13 | (2014.01) | |
| H03K 5/135 | (2006.01) | |

(52) U.S. Cl.
CPC .............. *H03K 19/003* (2013.01); *G06F 1/10* (2013.01); *G06F 13/4226* (2013.01); *H03K 5/131* (2013.01); *H03K 5/135* (2013.01)

(58) Field of Classification Search
CPC .............. G06F 1/12; G06F 1/14; G06F 1/10; G06F 5/06; G06F 13/1689; G06F 1/08; G06F 1/04; G06F 1/3202; G06F 9/4825; G06F 11/0757; G06F 11/3419; G11C 7/22
See application file for complete search history.

(56) References Cited

U.S. PATENT DOCUMENTS

| | | | | |
|---|---|---|---|---|
| 5,418,825 A * | 5/1995 | Cantrell | ................... | H03K 5/19 327/113 |
| 5,857,005 A * | 1/1999 | Buckenmaier | ............ | G06F 5/06 326/93 |
| 6,324,652 B1 * | 11/2001 | Henderson | ................ | G06F 1/08 713/500 |
| 6,584,536 B1 * | 6/2003 | Deng | .................... | H04L 7/0012 710/310 |
| 6,614,870 B1 * | 9/2003 | Miller | ................... | H03K 23/667 377/48 |
| 7,288,969 B1 * | 10/2007 | Sleigh | .................... | H03K 5/135 326/94 |
| 8,493,108 B2 * | 7/2013 | Nunes | .................... | H03K 5/135 327/141 |
| 2013/0227257 A1 * | 8/2013 | Singh | ........................ | G06F 1/24 713/1 |
| 2014/0351570 A1 * | 11/2014 | Chowdhury | .............. | G06F 1/24 713/1 |

* cited by examiner

*Primary Examiner* — Zahid Choudhury

(74) *Attorney, Agent, or Firm* — John R. Pessetto; Frank D. Cimino

(57) ABSTRACT

A data bus synchronizer includes a plurality of registers arranged in a cascade, configured to generate a synchronized output in response to sampling an asynchronous bus without an enable signal, where the plurality of registers receive a value on the asynchronous bus. A last register of the plurality of registers is configured to generate the synchronized output in response to a load enable signal. The data bus synchronizer further includes a logic block configured to generate the load enable signal on satisfaction of a logic condition.

14 Claims, 8 Drawing Sheets

US 9,287,869 B2

DATA BUS SYNCHRONIZER WITHOUT AN ENABLE SIGNAL INPUT

This application claims the benefit of Provisional Application No. 61/746,768, filed Dec. 28, 2012.

TECHNICAL FIELD

Embodiments of the disclosure relate to a data bus synchronizer in integrated circuits.

BACKGROUND

Advanced integrated circuits (ICs) consist of several circuits requiring different clock frequencies. The clock frequency is generated dynamically, based on a divider value generated using a system software. The divider value is placed on a bus which is asynchronous to a control clock input of the IC. Whenever a different clock frequency is desired, the system software changes the divider value placed on the asynchronous bus to change the clock frequency.

Synchronizing the asynchronous bus to the control clock input of the IC is challenging, as the control clock input is generated by a hardware that controls the IC. Since the hardware controls given to the control clock input are different from the system software controls, the system software could change the divider value when the control clock input is gated. The problem of synchronization is further complicated with the requirement that notwithstanding the gated control clock input, the latest change in the divider value must take effect. Further, when there is more than one change to the divider value in quick succession, it is necessary that the latest change is addressed irrespective of the intermediate changes.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

An example embodiment provides a data bus synchronizer that includes a plurality of registers arranged in a cascade. The plurality of registers is configured to receive a value on an asynchronous bus. The plurality of registers samples the asynchronous bus without an enable signal and generates a synchronized output. A last register of the plurality of registers is configured to generate the synchronized output in response to a load enable signal. A logic block is configured to generate the load enable signal on satisfaction of a logic condition.

Another example embodiment provides a phase locked loop. The phase locked loop includes a phase locked loop controller. The phase locked loop controller is configured to generate a clock divider value on an asynchronous bus. A divider controller receives the clock divider value and a control clock input and is configured to generate a division value. The divider controller comprises a data bus synchronizer. The data bus synchronizer includes a plurality of registers arranged in a cascade. The plurality of registers is configured to receive a value on an asynchronous bus. The plurality of registers sample the asynchronous bus without an enable signal and generates a synchronized output. A last register of the plurality of registers is configured to generate the synchronized output in response to a load enable signal. A logic block is configured to generate the load enable signal on satisfaction of a logic condition. A divider is configured to generate a clock output in response to the division value and a phase locked loop clock input.

An example method of generating a synchronized output from an asynchronous bus input that includes applying a value on an asynchronous bus to a plurality of registers arranged in a cascade. The asynchronous bus is then sampled directly without an enable signal. Then, a load enable signal is generated on satisfaction of a logic condition. Further, a last register of the plurality of registers is configured to generate the synchronized output in response to the load enable signal.

Other aspects and example embodiments are provided in the Drawings and the Detailed Description that follows.

BRIEF DESCRIPTION OF THE VIEWS OF DRAWINGS

DETAILED DESCRIPTION OF THE EMBODIMENTS

Figure 1:
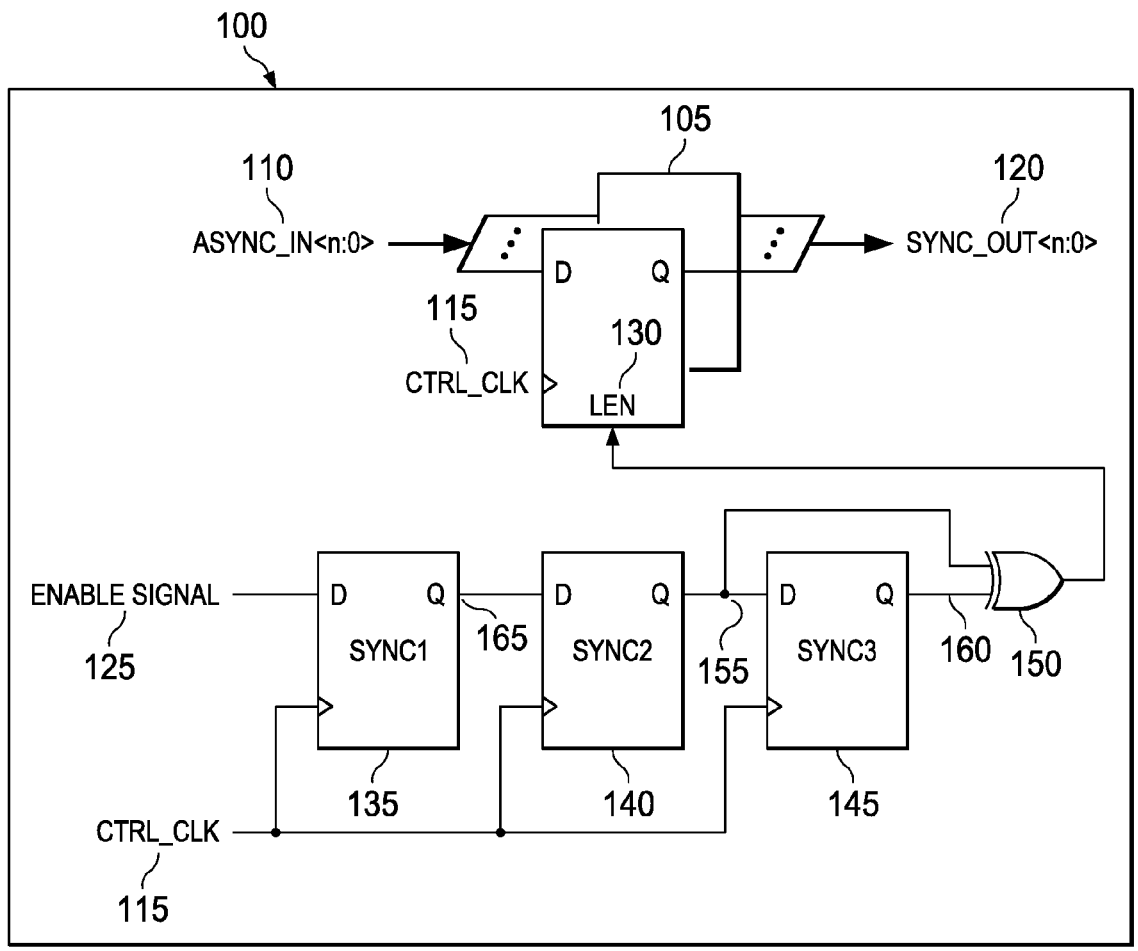
FIG. 1 illustrates a schematic of a data bus synchronizer.

FIG. 1 illustrates a schematic of a data bus synchronizer (100). The data bus synchronizer (100) includes an asynchronous bus (105) that receives an asynchronous bus input ASYNC_IN<n:0> (110), a control clock input (115) and a load enable signal (130). A synchronized output SYNC_OUT<n:0> (120) is generated at an output of the asynchronous bus (105). The load enable signal LEN (130) is generated using an enable signal (125). The enable signal (125) is received at a cascade of D flip-flops SYNC1 (135), SYNC2 (140) and SYNC3 (145) in addition to the control clock input (115). A XOR gate (150) receives an output (155) of SYNC2 (140) and an output (160) of SYNC3 (145) to generate the load enable signal (130).

In the data bus synchronizer (100), the asynchronous bus input ASYNC_IN<n:0> (110) is synchronized using the enable signal (125). Whenever there is a change in the asynchronous bus input ASYNC_IN<n:0> (110), the enable signal (125) is generated. The enable signal (125) is sampled on the control clock input (115). The sampled enable signal (125) is shifted through the cascade of D flip-flops SYNC1 (135), SYNC2 (140) and SYNC3 (145). The load enable signal LEN (130) is generated from the XOR of the output (155) of SYNC2 (140) and the output (160) of SYNC3 (145). When the load enable signal LEN (130) is high, the changed asynchronous bus input ASYNC_IN<n:0> (110) is loaded on the synchronized output SYNC_OUT<n:0> (120).

A system software is responsible for the changes in the asynchronous bus input ASYNC_IN<n:0> (110) placed on the asynchronous bus (105). The control clock input (115) is generated by a hardware that controls the chip. Since the hardware controls given to the control clock input (115) are different from the system software controls given to the asynchronous bus input ASYNC_IN<n:0> (110), the system software could change the asynchronous bus input ASYNC_IN<n:0> (110) when the control clock input (115) is gated. Therefore, the requirement that notwithstanding the gated control clock input (115), the latest change in the asynchronous bus input ASYNC_IN<n:0> (110) does not take effect. Further, when there is more than one change to the asynchronous bus input ASYNC_IN<n:0> (110) in quick succession, the latest change is not addressed.

Figure 2:
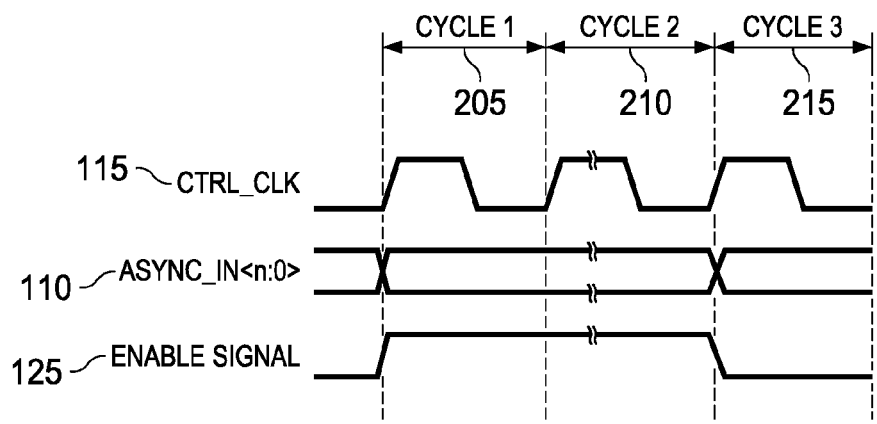
FIG. 2 is a timing diagram illustrating the generation of an enable signal for the data bus synchronizer.

FIG. 2 is a timing diagram illustrating the generation of an enable signal for the data bus synchronizer (100). From the timing diagram is can be seen that the value of the asynchronous bus input ASYNC_IN<n:0> (110) is changed at the beginning of a cycle 1 (205). Each cycle is defined based on the time period of the control clock 115. The enable signal (125) toggles every time there is a change in the asynchronous bus input ASYNC_IN<n:0> (110). Therefore, at the beginning of the cycle 1 (205), the enable signal (125) changes from logic 'low' to logic 'high'. Similarly at the beginning of a cycle 3 (215) there is a change in the asynchronous bus input ASYNC_IN<n:0> (110) causing the enable signal (125) to change from logic 'high' to logic 'low'.

Figure 3:
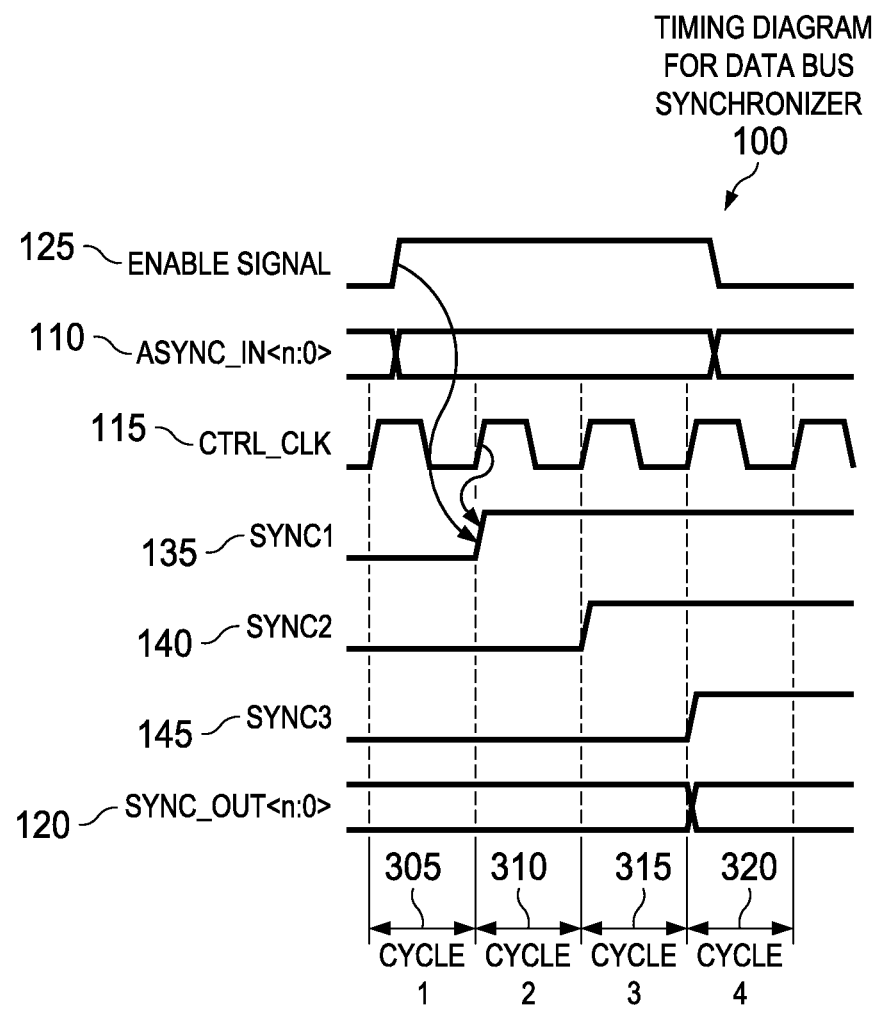
FIG. 3 illustrates a timing diagram of the working of the data bus synchronizer.

FIG. 3 illustrates a timing diagram of the working of the data bus synchronizer (100). The asynchronous bus input ASYNC_IN<n:0> (110) change during cycle 1 (305) and causes the enable signal (125) to change from logic 'low' to logic 'high'. The changed enable signal (125) is shifted at the beginning of cycle 2 (310), cycle 3 (315) and cycle 4 (320) through the cascade of D flip-flops SYNC1 (135), SYNC2 (140) and SYNC3 (145) respectively. The load enable signal LEN (130) of FIG. 1 is generated from the XOR of the output (155) of SYNC2 (140) and the output (160) of SYNC3 (145). The XOR of the output (155) of SYNC2 (140) and the output (160) of SYNC3 (145) during cycle 3 (315) is a logic 'high' as SYNC2 (140) is logic 'high' and SYNC3 (145) is logic 'low'. Therefore, at the beginning of cycle 4 (320), the value of the asynchronous bus input ASYNC_IN<n:0> (110) is loaded onto the SYNC_OUT<n:0> (120). It can be seen from the FIG. 3 that the CTRL_CLK (115) must run continuously without which the sampling of the enable signal (125) will not take place. If the enable signal (125) sampling is missed, then the latest value of the asynchronous bus input ASYNC_IN<n:0> (110) will not be sampled. In light of this shortcoming a data bus synchronizer is proposed, as described in FIG. 4.

Figure 4:
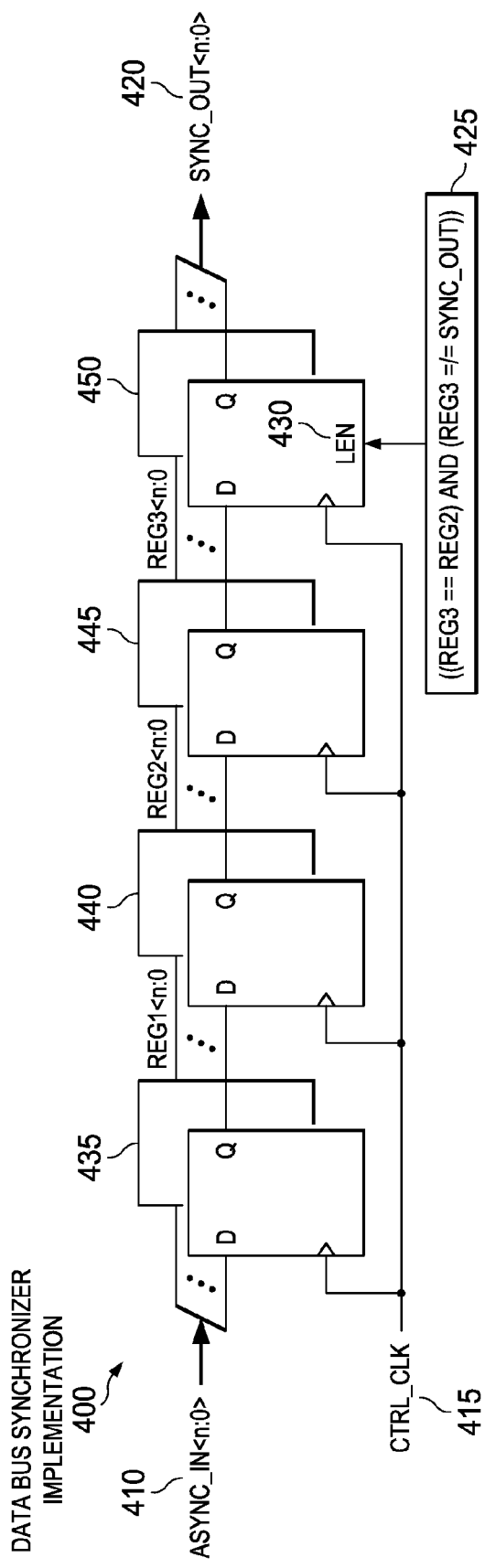
FIG. 4 illustrates a schematic of a data bus synchronizer, according to an embodiment.

FIG. 4 illustrates a schematic of a data bus synchronizer (400) according to an embodiment. The data bus synchronizer (400) includes a plurality of registers (435), (440), (445) and (450) arranged in a cascade. The plurality of registers (435), (440), (445) and (450) are configured to receive a value on an asynchronous bus input ASYNC_IN<n:0> (410). The plurality of registers sample the asynchronous bus input ASYNC_IN<n:0> (410) without an enable signal (125) and generates a synchronized output SYNC_OUT<n:0> (420). A last register (450) of the plurality of registers is configured to generate the synchronized output SYNC_OUT<n:0> (420) in response to a load enable signal LEN (430). A logic block 425 is configured to generate the load enable signal LEN (430) on satisfaction of a logic condition.

In the data bus synchronizer (400), the value received at the plurality of registers (435), (440), (445) and (450) is a multi bit signal in one embodiment. The asynchronous bus input ASYNC_IN<n:0> (410) is synchronized to a control clock input (415) such that a latest stable value on the asynchronous bus input ASYNC_IN<n:0> (410) is always sampled to generate the synchronized output SYNC_OUT<n:0> (420). The latest stable value on the asynchronous bus input ASYNC_IN<n:0> (410) is always sampled irrespective of toggling rate of the asynchronous bus input ASYNC_IN<n:0> (410) with respect to the control clock input (415). The logic condition, when the load enable is generated upon satisfaction, is given as ((REG3==REG2) AND (REG3=/=SYNC_OUT)); where REG2 (440) and REG3 (445) are two subsequent registers prior to the last register (450). SYNC_OUT<n:0> (420) is the synchronized output SYNC_OUT<n:0> generated by the data bus synchronizer (400). (REG3==REG2) indicates that a stable value on the asynchronous bus input ASYNC_IN<n:0> (410) has been sampled. (REG3=/=SYNC_OUT) checks if the latest stable value is different from the synchronized output SYNC_OUT<n:0> (420). SYNC_OUT<n:0> (420) is generated only when both (REG3==REG2) and (REG3=/=SYNC_OUT). Any value on the asynchronous bus input ASYNC_IN<n:0> (410) is sampled when the asynchronous bus input ASYNC_IN<n:0> (410) toggles at one third the toggling rate of the control clock input (415). A maximum tolerable skew rate of the data bus synchronizer (400) is generated by subtracting from a clock period of the control clock input (415), a setup hold time for an edge of the control clock input (415).

Figure 5:
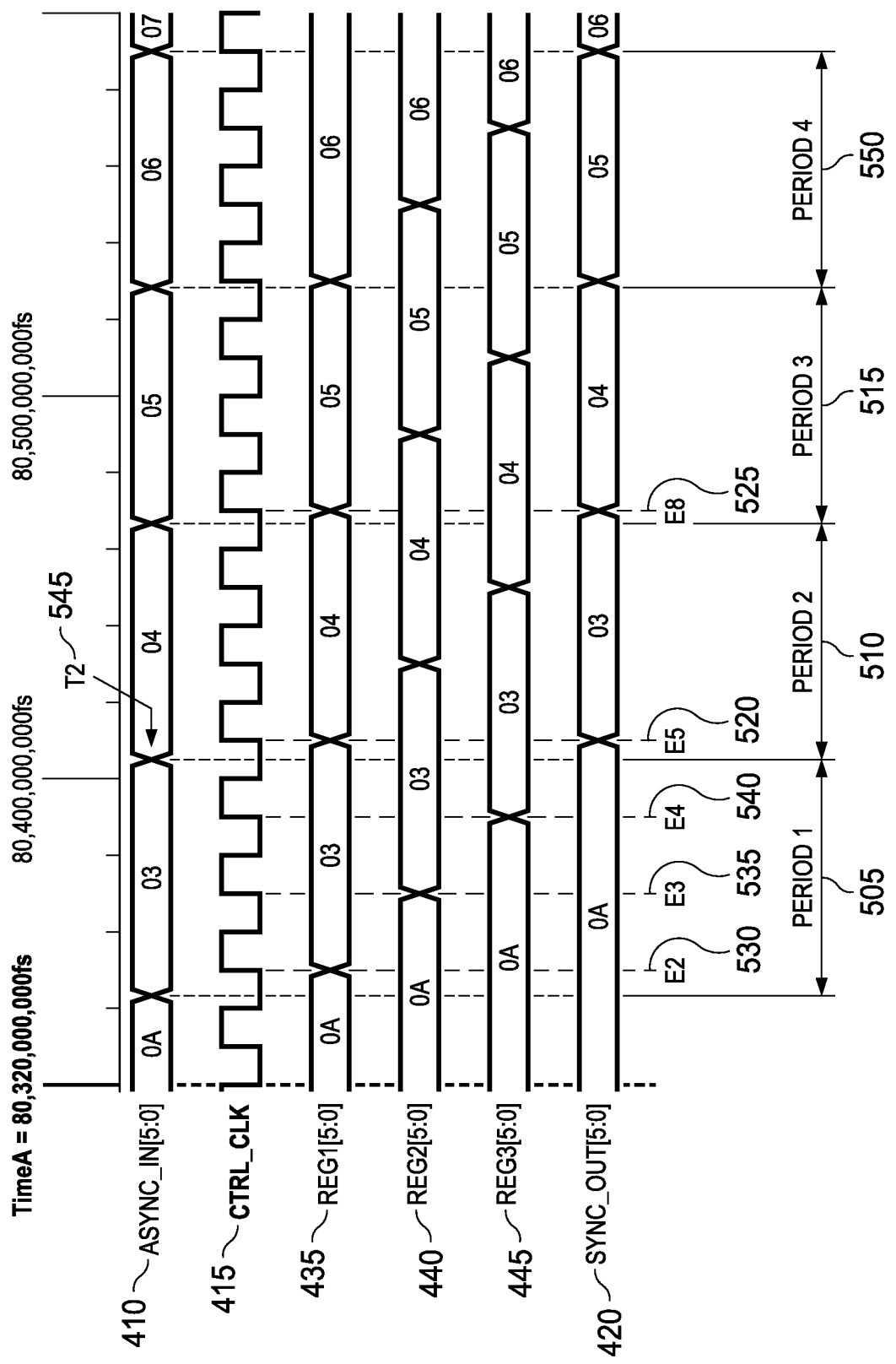
FIG. 5 is a timing diagram illustrating the working of the data bus synchronizer when the asynchronous bus toggles at one third the toggling rate of the control clock input, according to an embodiment.

The operation of the data bus synchronizer (400) is explained using FIGS. 5, 6, 7 and 8. FIG. 5 is a timing diagram illustrating the working of the data bus synchronizer (400) when the asynchronous bus input ASYNC_IN<n:0> (410) toggles at one third the toggling rate of the control clock input (415), according to an embodiment. In FIG. 5, 'n' is equal to 5, hence the asynchronous bus input ASYNC_IN<n:0> (410) is of 6 bits. Period 1 (505), period 2 (510), period 3 (515) and period 4 (550) depict the time intervals during which the value on the asynchronous bus input ASYNC_IN<n:0> (410) is constant. Transition T2 (545) denotes the change in the value on the asynchronous bus input ASYNC_IN<n:0> (410) from 03 to 04. During period 1 (505), period 2 (510), period 3 (515) and period 4 (550), the number of control clock input (415) clock cycles is 3. Consider the period 1 (505), the value on the asynchronous bus input ASYNC_IN<n:0> (410) is 03. The value 03 is loaded onto the REG1 at the clock edge E2 (530) of the control clock input (415). The value 03 is shifted to REG2 at the clock edge E3 (535) of the control clock input (415) and further shifted onto REG3 at the clock edge E4 (540) of the control clock input (415). At T2 (545), the load enable signal LEN (430) is logic high as the value 03 of REG2==the value 03 of REG3, and the value 03 of REG3=/=the value 0A on the SYNC_OUT<n:0> (420). Since the load enable signal LEN (430) is logic high as the value 03 remains constant for 3 cycles of the control clock input (415), the value 03 is faithfully loaded onto the synchronized output SYNC_OUT<n:0> (420) at the clock edge E5 (520) of the control clock input (415). This operation is similarly seen during period 2 (510), period 3 (515) and period 4 (550) as the value on the asynchronous bus input ASYNC_IN<n:0> (410) remains constant for 3 clock cycles of the control clock input (415).

Figure 6:
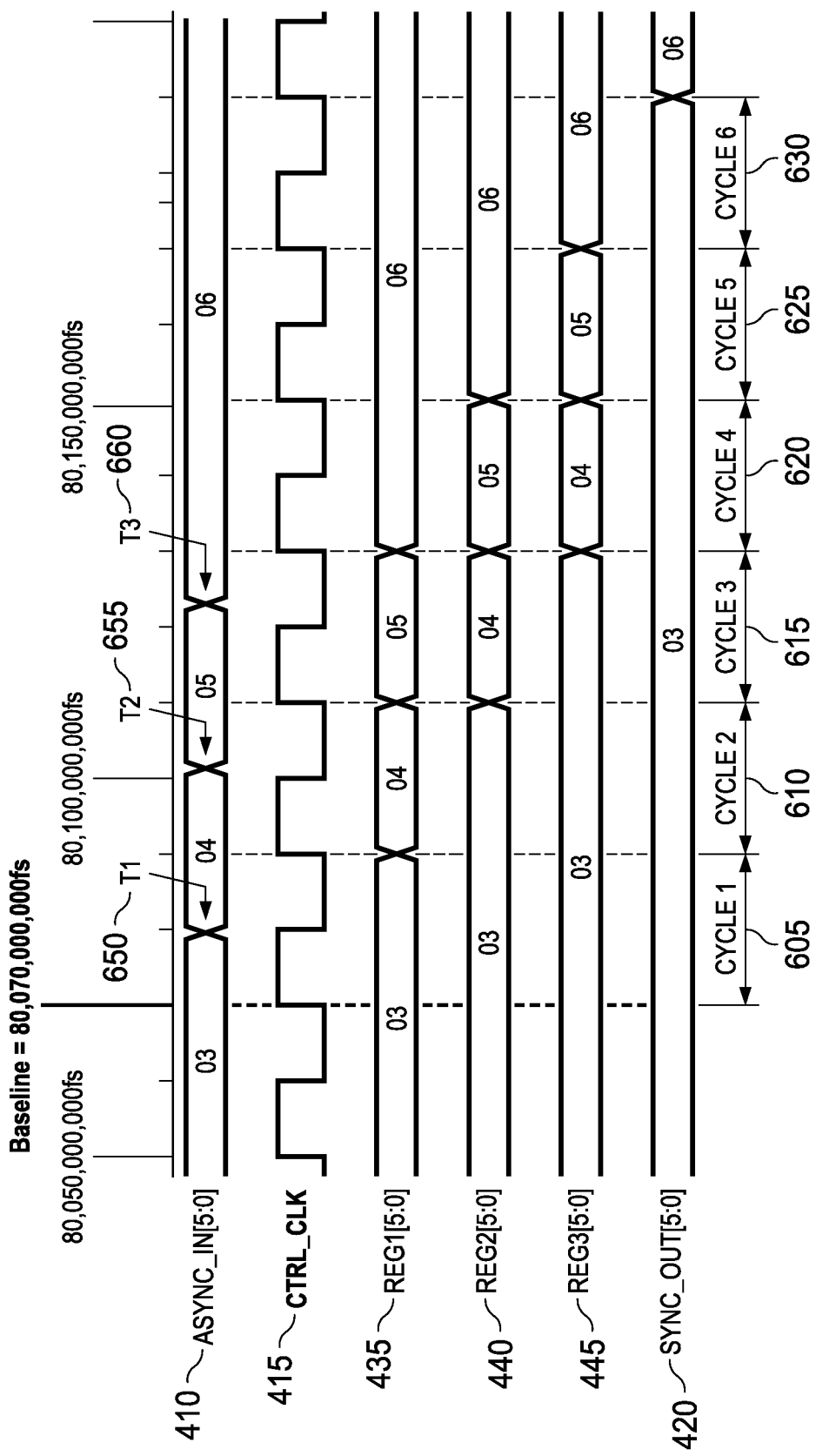
FIG. 6 is a timing diagram illustrating the working of the data bus synchronizer when the asynchronous bus toggles at more than one third the toggling rate of the control clock input, according to an embodiment.

FIG. 6 is a timing diagram illustrating the working of the data bus synchronizer (400) when the asynchronous bus input ASYNC_IN<n:0> (410) toggles at more than one third the toggling rate of the control clock input (415), according to an embodiment. In FIG. 6, 'n' is equal to 5, hence the asynchronous bus input ASYNC_IN<n:0> (410) is of 6 bits. Every cycle in the FIG. 6 depicts one clock period of the control clock input (415). The value on the asynchronous bus input ASYNC_IN<n:0> (410) at the transition T1 (650) changes from 03 to 04 and at transition T2 (655) the value changes from 04 to 05 and once again the value at transition T3 (660) changes from 05 to 06. Therefore, the asynchronous bus input ASYNC_IN<n:0> (410) has toggled at a rate more than one third the toggling rate of the control clock input (415). The value 04 is loaded onto REG1 at the commencement of cycle 2 (610) and is shifted through REG2 and REG3 in the subsequent cycle 3 (615) and cycle 4 (620). The load enable signal LEN (430) is logic 'low' during cycle 4 (620), as the value 05 on REG2 is not the same as the value 04 on REG3. This is similarly seen during cycle 5 (625) as the value 06 on REG2 is not the same as the value 05 on REG3. During the cycle 6 (630) the load enable signal LEN (430) is logic high as the value 06 of REG2==the value 06 REG3, and the value 06 of REG3=/=the value 03 on the SYNC_OUT<n:0> (420). Therefore, the logic condition (REG3==REG2) ensures that only a stable value on the asynchronous bus input ASYNC_IN<n:0> (410) is sampled; and the condition (REG3=/=SYNC_OUT) ensures that the latest stable value is loaded on the synchronized output SYNC_OUT<n:0> (420).

Figure 7:
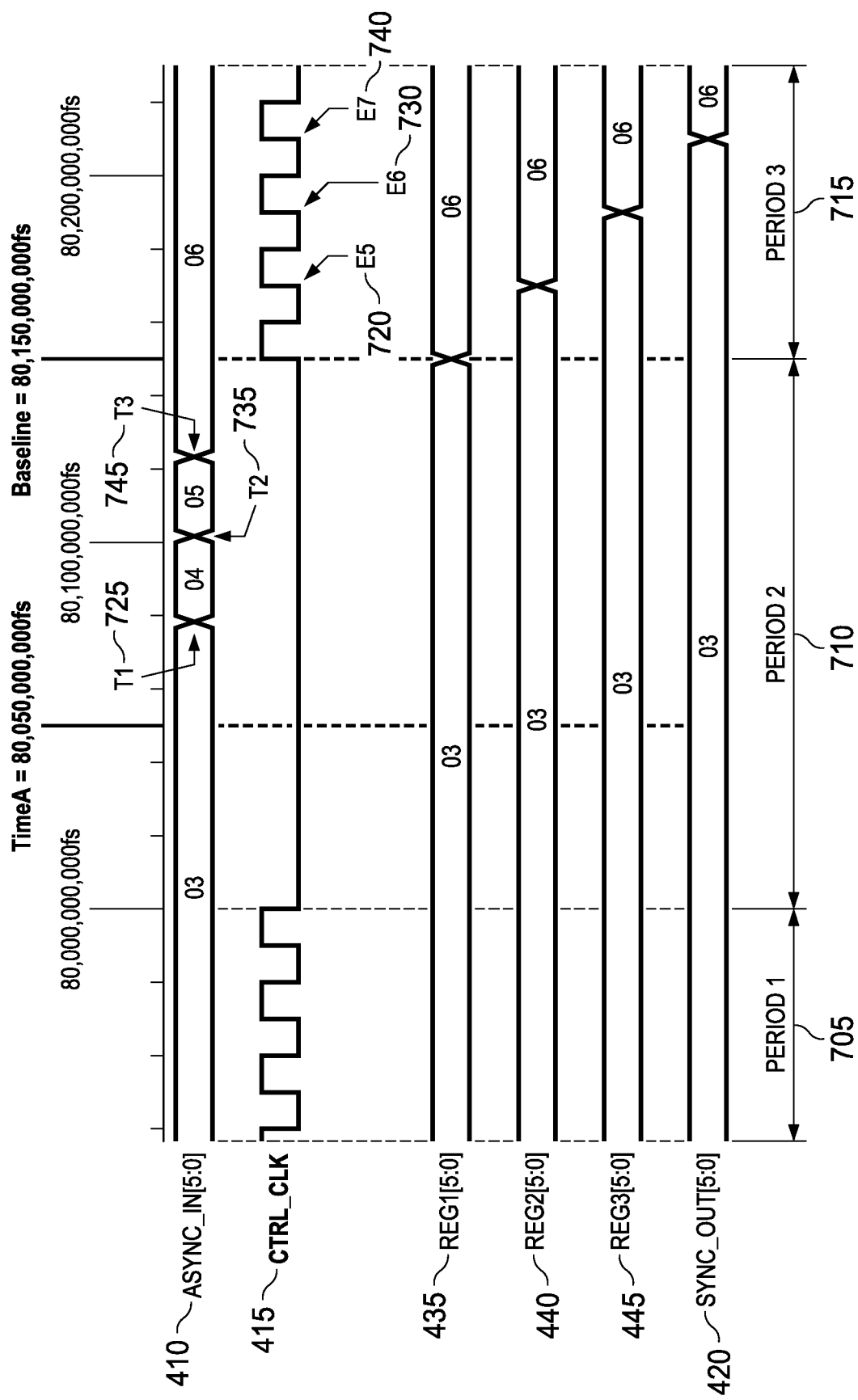
FIG. 7 is a timing diagram illustrating the working of the data bus synchronizer when a control clock input is gated intermittently, according to an embodiment.

FIG. 7 is a timing diagram illustrating the working of the data bus synchronizer (400) when the control clock input (415) is gated intermittently, according to an embodiment. In FIG. 7, 'n' is equal to 5, hence the asynchronous bus input ASYNC_IN<n:0> (410) is of 6 bits. Period 1 (705) depicts the period during which the control clock input (415) is running continuously. Period 2 (710) depicts the period during which the control clock input (415) is gated, and period 3 (715) depicts the period during which the control clock input (415) resumes toggling. Transition T1 (725) denotes the change in the value on the asynchronous bus input ASYNC_IN<n:0> (410) from 03 to 04. Transition T2 (735) denotes the change in the value on the asynchronous bus input ASYNC_IN<n:0> (410) from 04 to 05 and transition T3 (745) denotes the change in the value on the asynchronous bus input ASYNC_IN<n:0> (410) from 05 to 06. During the period 2 (710) the registers REG1 (435), REG2 (440) and REG3 (445) are gated and hence no value is loaded on the registers. During the period 3 (715) when the control clock input (415) resumes toggling the value 06 is loaded into the REG1 (435) at the beginning of the period 3 (715). At an edge E6 (730) of the control clock input (415) the value on the REG2 (440) and REG3 (445) is the same and the value on REG3 (445) is not the same as the SYNC_OUT<n:0> (420), therefore the load enable signal LEN (430) is logic high and the value 06 is loaded on the synchronized output SYNC_OUT<n:0> (420) on the edge E7 of the control clock input (415). Therefore, the asynchronous bus input ASYNC_IN<n:0> (410) is synchronized to the control clock input (415) such that the latest stable value on the asynchronous bus input ASYNC_IN<n:0> (410) is always sampled and hence generating the synchronized output SYNC_OUT<n:0> (420).

FIGS. 5, 6 and 7 illustrate how the data bus synchronizer (400) directly samples the asynchronous bus input ASYNC_IN<n:0> (410) to generate the synchronized output SYNC_OUT<n:0> (420). The FIGS. 5,6 and 7 also illustrates how the data bus synchronizer (400) addresses the problem of synchronization when the system software changes the asynchronous bus input ASYNC_IN<n:0> (410) and when the hardware gates the control clock input (415). Hence the requirement that, notwithstanding the gated control clock input (415) the latest change in the asynchronous bus input ASYNC_IN<n:0> (410) must take effect; is addressed. Further, when there is more than one change to the asynchronous bus input ASYNC_IN<n:0> (410) in quick succession, the latest change is loaded on the SYNC_OUT<n:0> (420). Thus the data bus synchronizer (400) addresses all the problems faced while using the data bus synchronizer (100) as described in FIGS. 1, 2 and 3.

Figure 8:
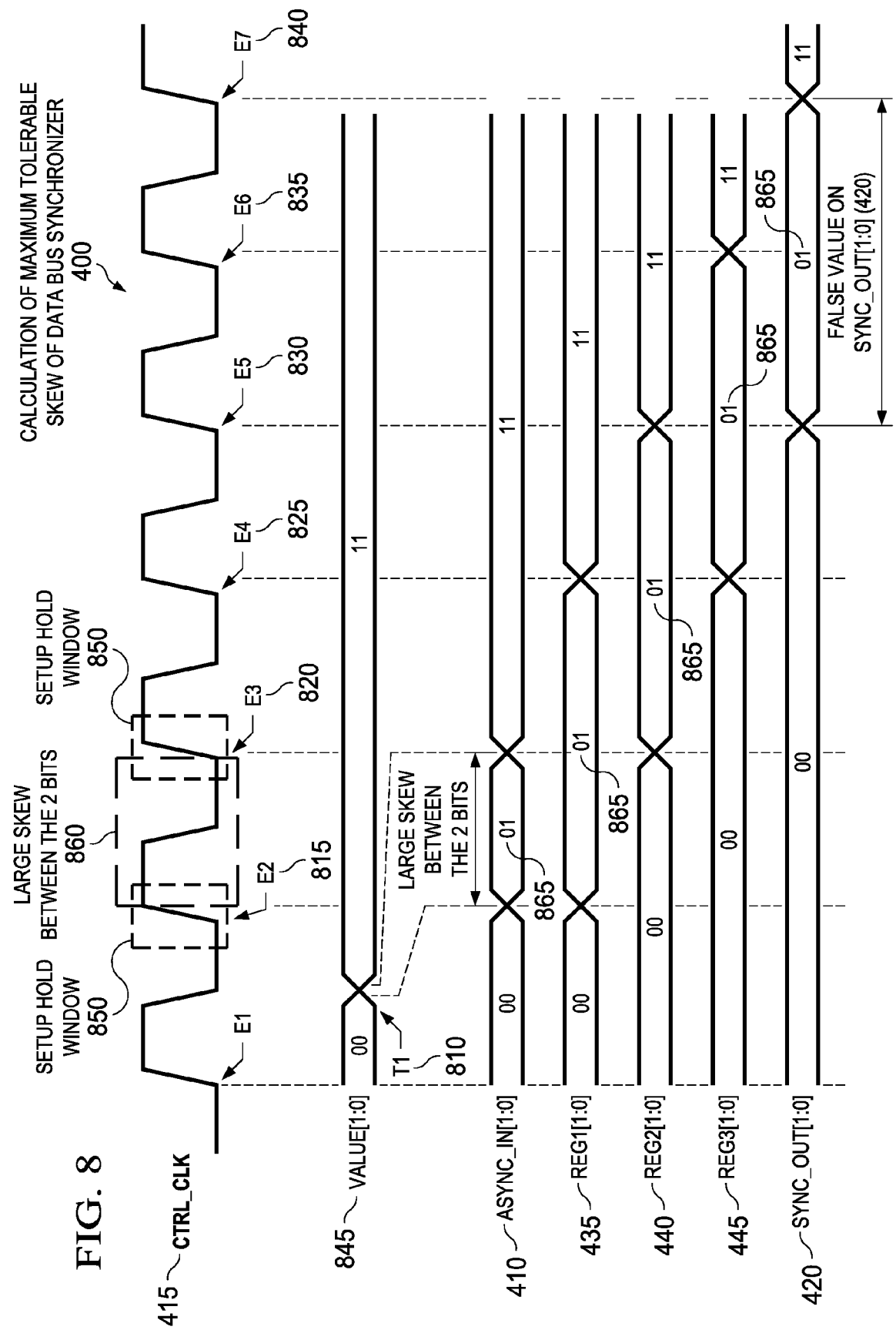
FIG. 8 is a timing diagram illustrating the calculation of a maximum tolerable skew rate for the data bus synchronizer, according to an embodiment.

FIG. 8 is a timing diagram illustrating the calculation of a maximum tolerable skew rate for the data bus synchronizer (400), according to an embodiment. A setup hold window (850) denotes the sum of time lapsed due to the "Setup time" and "Hold time". "Setup time" is defined as the time interval during which the data must remain stable (no transitions) prior to a clock transition. "Hold time" is defined as the time interval during which the data must remain stable after the clock transition. A divider value (845) is given as input to the asynchronous bus input ASYNC_IN<n:0> (410). At the transition T1 (810) the divider value changes from 00 to 11, but at the edge E2 (815) of the control clock input (415) a large skew (860) between the bits introduces a false value 01 (865) on the asynchronous bus input ASYNC_IN<n:0> (410). The false value 01 (865) is sampled once at edge E2 (815) and once again at edge E3 (820), therefore the false value 01 (865) is present on REG1 (435) over two clock cycles E2 (815) to E4 (825). This false value 01 (865) is shifted to REG2 (440) and REG3 (445) on edges E3 (820) and E4 (825) respectively. On the edge E5 (830) the load enable signal LEN (430) is logic high as the false value 01 (865) is on the REG2 (440) and REG3 (445) and the false value 01 (865) on REG3 (445) is not the same as the value 00 on the SYNC_OUT<n:0> (420). Therefore, the false value 01 (865) gets loaded onto the synchronized output SYNC_OUT<n:0> (420). To avoid this false value 01 (865) to reach the SYNC_OUT<n:0> (420), the maximum tolerable skew rate must be less than or equal to the period of control clock input (415) minus the setup hold window (850).

Figure 9:
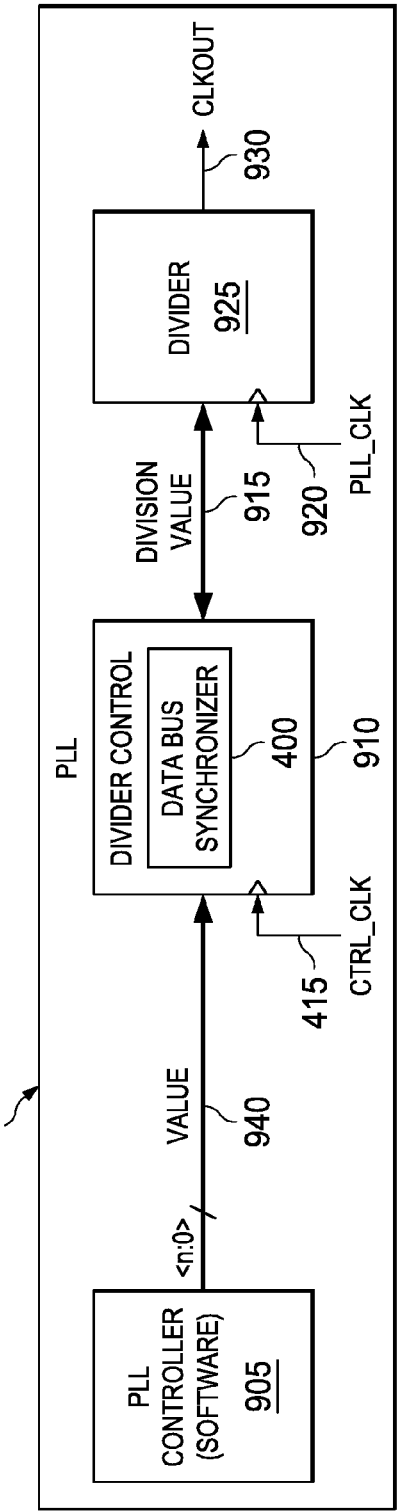
FIG. 9 illustrates a schematic of a phase locked loop using the data bus synchronizer, according to an embodiment.

FIG. 9 illustrates a schematic of a phase locked loop (900) using the data bus synchronizer (400), according to an embodiment. The phase locked loop (900) includes a phase locked loop controller (905) which is configured to generate a clock divider value (940). A divider controller (910), receiving the clock divider value (940) and a control clock input (415), is configured to generate a division value (915). The divider controller (910) comprises a data bus synchronizer (400). The data bus synchronizer (400) includes a plurality of registers (435), (440), (445) and (450) arranged in a cascade. The plurality of registers (435), (440), (445) and (450) are configured to receive a value on an asynchronous bus input ASYNC_IN<n:0> (410). The plurality of registers sample the asynchronous bus input ASYNC_IN<n:0> (410) without an enable signal (125) and generates a synchronized output SYNC_OUT<n:0> (420). A last register (450) of the plurality of registers is configured to generate the synchronized output SYNC_OUT<n:0> (420) in response to a load enable signal LEN (430). A logic block (425) that is configured to generate the load enable signal LEN (430) on satisfaction of a logic condition. A divider (925) which is configured to generate a clock output (930) in response to the division value (915) and a phase locked loop clock input (920).

In the data bus synchronizer (400) the value received at the plurality of registers (435), (440), (445) and (450) is a multi bit signal in one embodiment. The asynchronous bus input ASYNC_IN<n:0> (410) is synchronized to a control clock input (415) such that a latest stable value on the asynchronous bus input ASYNC_IN<n:0> (410) is always sampled to generate synchronized output SYNC_OUT<n:0> (420). The latest stable value on the asynchronous bus input ASYNC_IN<n:0> (410) is always sampled irrespective of the toggling rate of the asynchronous bus input ASYNC_IN<n:0> (410) with respect to the control clock input (415). The logic condition, when the load enable is generated upon satisfaction, is given as ((REG3==REG2) AND (REG3=/=SYNC_OUT)); where REG2 (440) and REG3 (445) are two subsequent registers prior to the last register (450). SYNC_OUT<n:0> (420) is the synchronized output SYNC_OUT<n:0> (420) generated by the data bus synchronizer (400). (REG3==REG2) indicates that a stable value on the asynchronous bus input ASYNC_IN<n:0> (410) has been sampled. (REG3=/=SYNC_OUT) checks if the latest stable value is different from the synchronized output SYNC_OUT<n:0> (420). SYNC_OUT<n:0> (420) is generated only when both (REG3==REG2) and (REG3=/=SYNC_OUT). Any value on the asynchronous bus input ASYNC_IN<n:0> (410) is sampled when the asynchronous bus input ASYNC_IN<n:0> (410) toggles at one third the toggling rate of the control clock input (415). A maximum tolerable skew between the bits of the multi bit signal given on the asynchronous bus input ASYNC_IN<n:0> (410) of the data bus synchronizer (400) is generated by subtracting from a clock period of the control clock input (415), a setup hold time for an edge of the control clock input (415).

By using the data bus synchronizer (400), the asynchronous bus input ASYNC_IN<n:0> (410) is directly sampled to generate the synchronized output SYNC_OUT<n:0> (420). The data bus synchronizer (400) also addresses the problem of synchronization when the system software changes in the asynchronous bus input ASYNC_IN<n:0> (410) and when the hardware gates the control clock input (415). Hence the requirement that, notwithstanding the gated control clock input (415) the latest change in the asynchronous bus input ASYNC_IN<n:0> (410) must take effect; is addressed. Further, when there is more than one change to the value on the asynchronous bus input ASYNC_IN<n:0> (410) in quick succession, the latest change is loaded on the SYNC_OUT<n:0> (420). Thus the data bus synchronizer (400) addresses all the problems faced while using the data bus synchronizer (100) as described in FIGS. 1, 2 and 3.

Figure 10:
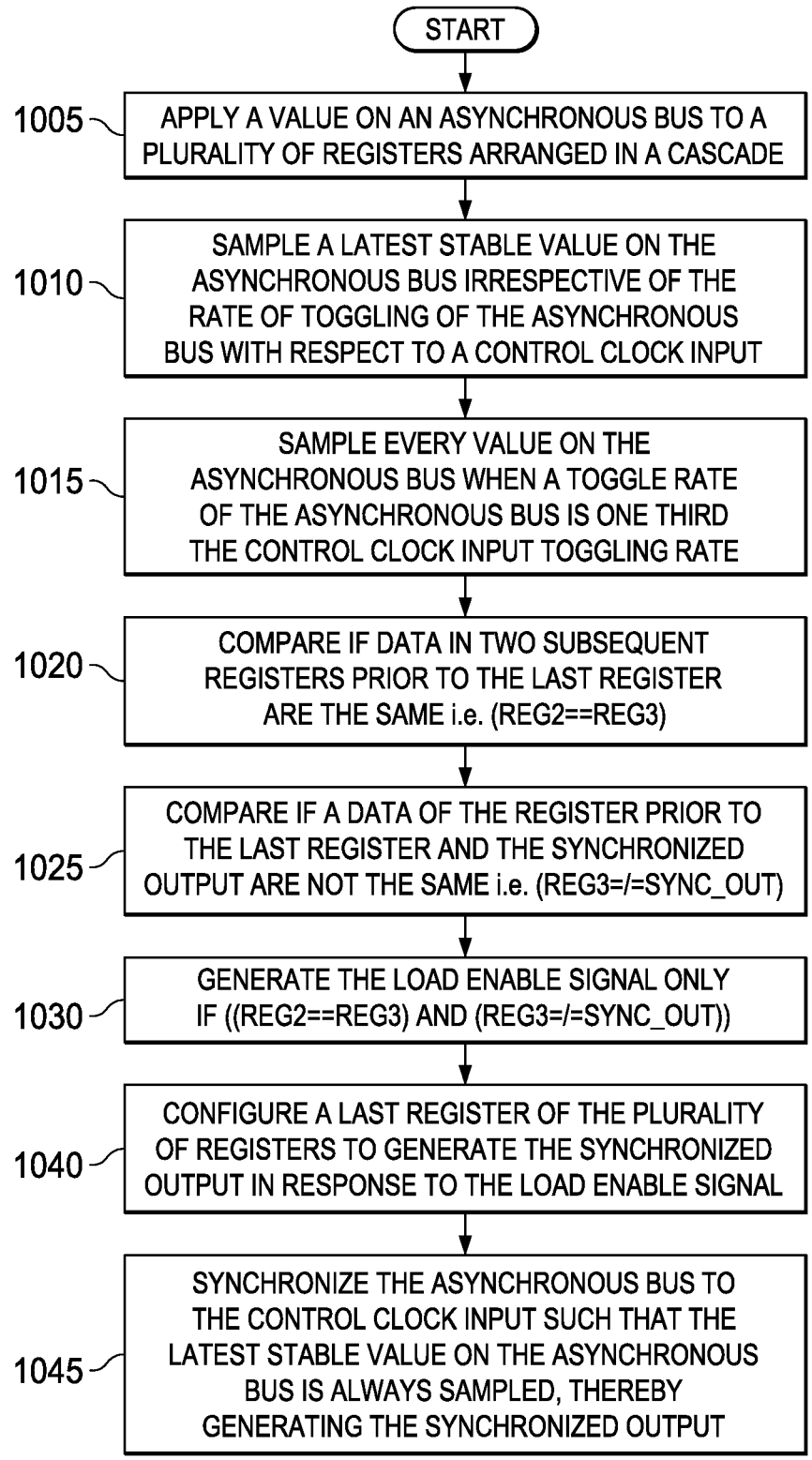
FIG. 10 is a flowchart illustrating the working of the data bus synchronizer, according to an embodiment.

FIG. 10 is a flowchart illustrating the working of the data bus synchronizer (400), according to an embodiment. FIG. 10 illustrates the method of generating a synchronized output SYNC_OUT<n:0> (420) from an asynchronous bus input ASYNC_IN<n:0> (410). At step 1005, a value is applied on an asynchronous bus to a plurality of registers arranged in a cascade. The asynchronous bus is directly sampled without an enable signal. A latest stable value on the asynchronous bus input ASYNC_IN<n:0> (410) is sampled irrespective of the rate of toggling of the asynchronous bus with respect to a control clock input, at step 1010. At step 1015 any value on the asynchronous bus input ASYNC_IN<n:0> (410) is sampled when a toggle rate of the asynchronous bus is one third the control clock input toggling rate. A load enable signal LEN (430) is generated on satisfaction of a logic condition. The generation of load enable signal LEN (430) includes comparing if data in two registers preceding a last register are the same, as shown in step 1020 and comparing if a data of the register preceding the last register (450) and the synchronized output SYNC_OUT<n:0> (420) are not the same, as shown in step 1025. At step 1030, the load enable signal LEN (430) is generated only if data in two registers (440) and (445) preceding the last register (450) are the same and a data of the register preceding (445) the last register (450) and the synchronized output SYNC_OUT<n:0> (420) are not the same. The last register (450) of the plurality of registers is configured to generate the synchronized output SYNC_OUT<n:0> (420) in response to the load enable signal (430) at step 1040. At step 1045, the asynchronous bus input ASYNC_IN<n:0> (410) to the control clock input (415) such that the latest stable value on the asynchronous bus input ASYNC_IN<n:0> (410) is always sampled, thereby generating the synchronized output SYNC_OUT<n:0> (420).

In the foregoing discussion, the terms "connected" means at least either a direct electrical connection between the devices connected or an indirect connection through one or more passive intermediary devices. The term "circuit" means at least either a single component or a multiplicity of passive components, that are connected together to provide a desired function. The term "signal" means at least one current, voltage, charge, data, or other signal. Also, the terms "coupled to" or "couples with" (and the like) are intended to describe either an indirect or direct electrical connection. Thus, if a first device is coupled to a second device, that connection can be through a direct electrical connection, or through an indirect electrical connection via other devices and connections. Further, the term "high" is generally intended to describe a signal that is at logic state "1," and the term "low" is generally intended to describe a signal that is at logic state "0." The term "on" applied to a transistor or group of transistors is generally intended to describe gate biasing to enable current flow through the transistor or transistors.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A data bus synchronizer comprising:
    a plurality of registers arranged in a cascade, configured to generate a synchronized output in response to sampling an asynchronous bus without an enable signal, wherein the plurality of registers receive a value on the asynchronous bus and wherein the asynchronous bus is synchronized to a control clock input such that a latest stable value on the asynchronous bus is always sampled, irrespective of a toggling rate of the asynchronous bus with respect to the control clock input, thereby generating the synchronized output;
    a last register of the plurality of registers, configured to generate the synchronized output in response to a load enable signal; and
    a logic block that is configured to generate the load enable signal on satisfaction of a logic condition.

2. The data bus synchronizer of claim 1, wherein the value received at the plurality of registers is a multi bit signal.

3. The data bus synchronizer of claim 1, wherein the logic condition is ((REG3==REG2) AND (REG3=/=SYNC_OUT)), wherein:
    REG2 and REG3 are two subsequent registers prior to the last register;
    SYNC_OUT is the synchronized output generated by the data bus synchronizer;
    (REG3==REG2) indicates that a stable value on the asynchronous bus has been sampled;

(REG3=/=SYNC_OUT) checks if the latest stable value is different from the synchronized output; and SYNC_OUT is generated when both (REG3==REG2) and (REG3=/=SYNC_OUT).

4. The data bus synchronizer of claim 1, wherein any value on the asynchronous bus is sampled when the asynchronous bus toggles at one third the toggling rate of the control clock input.

5. The data bus synchronizer of claim 1, wherein a maximum tolerable skew rate is generated by subtracting from a clock period of the control clock input, a setup hold time for an edge of the control clock input.

6. A phase locked loop comprising:
   a phase locked loop controller configured to generate a clock divider value on an asynchronous bus;
   a divider controller receiving the clock divider value and a control clock input, configured to generate a division value, wherein the divider controller comprises a data bus synchronizer; wherein the data bus synchronizer further comprises:
      a plurality of registers arranged in a cascade, configured to generate a synchronized output in response to sampling an asynchronous bus without an enable signal, wherein the plurality of registers receive a value on the asynchronous bus and wherein the asynchronous bus is synchronized to a control clock input such that a latest stable value on the asynchronous bus is always sampled, irrespective of a toppling rate of the asynchronous bus with respect to the control clock input, thereby generating the synchronized output; a last register of the plurality of registers, configured to generate the synchronized output in response to a load enable signal; and
      a logic block that is configured to generate the load enable signal on satisfaction of a logic condition; and
   a divider configured to generate a clock output in response to the division value and a phase locked loop clock input.

7. The phase locked loop of claim 6, wherein the value received at the plurality of registers is a multi bit signal.

8. The phase locked loop of claim 6, wherein the logic condition being ((REG3==REG2) AND (REG3=/=SYNC_OUT)); wherein:
   REG2 and REG3 are two subsequent registers prior to the last register;
   SYNC_OUT is the synchronized output generated by the data bus synchronizer;
   (REG3==REG2) indicates that a stable value on the asynchronous bus has been sampled;
   (REG3=/=SYNC_OUT) checks if the latest stable value is different from the synchronized output; and
   SYNC_OUT is generated when both (REG3==REG2) and (REG3=/=SYNC_OUT).

9. The phase locked loop of claim 6, wherein any value on the asynchronous bus is sampled when the asynchronous bus toggles at one third the toggling rate of the control clock input.

10. The phase locked loop of claim 6, wherein a maximum tolerable skew rate is generated by subtracting from a clock period of the control clock input, a setup hold time for an edge of the control clock input.

11. A method of generating a synchronized output from an asynchronous bus input, comprising:
    applying a value on an asynchronous bus to a plurality of registers arranged in a cascade;
    sampling the asynchronous bus directly without an enable signal wherein sampling includes sampling a latest stable value on the asynchronous bus irrespective of a toggling rate of the asynchronous bus with respect to a control clock input; and sampling every value on the asynchronous bus when the toggling rate of the asynchronous bus is one third the toggling rate of the control clock input;
    generating a load enable signal on satisfaction of a logic condition; and
    configuring a last register of the plurality of registers to generate the synchronized output in response to the load enable signal.

12. The method of claim 11, wherein generating comprises:
    comparing if data in two registers preceding the last register are same;
    comparing if data of a register preceding the last register and the synchronized output are different; and
    generating the load enable signal only if data in two registers preceding the last register are same and data of the register preceding the last register and the synchronized output are different.

13. The method of claim 11, further comprising:
    synchronizing the asynchronous bus to the control clock input such that the latest stable value on the asynchronous bus is always sampled, thereby generating the synchronized output.

14. The method of claim 11, further comprising:
    subtracting from a clock period of the control clock input, a setup hold time for an edge of the control clock input, to generate a maximum tolerable skew rate.

* * * * *